(12) United States Patent
Benveniste

(10) Patent No.: US 6,956,225 B1
(45) Date of Patent: Oct. 18, 2005

(54) METHOD AND APPARATUS FOR SELECTIVE PRE-DISPERSION OF EXTRACTED ION BEAMS IN ION IMPLANTATION SYSTEMS

(75) Inventor: Victor M. Benveniste, Gloucester, MA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 10/815,586

(22) Filed: Apr. 1, 2004

(51) Int. Cl.[7] ............................................. H01J 37/317
(52) U.S. Cl. ........................ 250/492.21; 250/396 ML
(58) Field of Search .................. 250/492.21, 396 ML, 250/298

(56) References Cited

U.S. PATENT DOCUMENTS

| | | |
|---|---|---|
| 5,703,375 A | 12/1997 | Chen et al. |
| 6,130,436 A | 10/2000 | Renau et al. |
| 6,313,475 B1 | 11/2001 | Renau et al. |
| 6,403,967 B1 | 6/2002 | Chen et al. |
| 6,573,517 B1 * | 6/2003 | Sugitani et al. ........ 250/492.21 |
| 2003/0066976 A1 | 4/2003 | Chen et al. |
| 2003/0200930 A1 | 10/2003 | Chen et al. |

* cited by examiner

*Primary Examiner*—Jack I. Berman
(74) *Attorney, Agent, or Firm*—Eschweiler & Associates, LLC

(57) ABSTRACT

Ion implantation systems are provided, comprising a dispersion system located between an ion source and a mass analyzer, that operates to selectively pass an extracted ion beam from the ion source toward the mass analyzer or to direct a dispersed ion beam toward the mass analyzer, where the dispersed ion beam has fewer ions of an undesired mass range than the extracted ion beam.

25 Claims, 8 Drawing Sheets

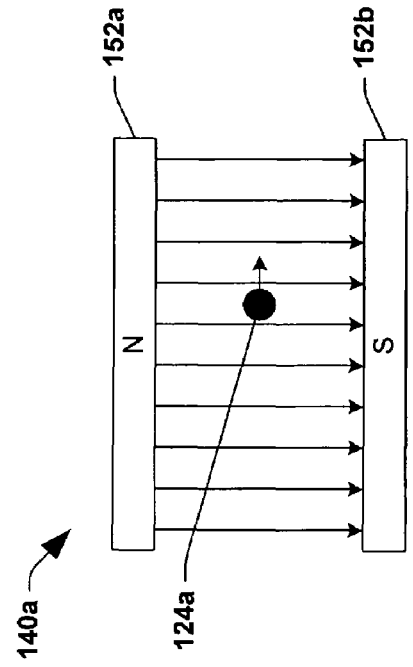
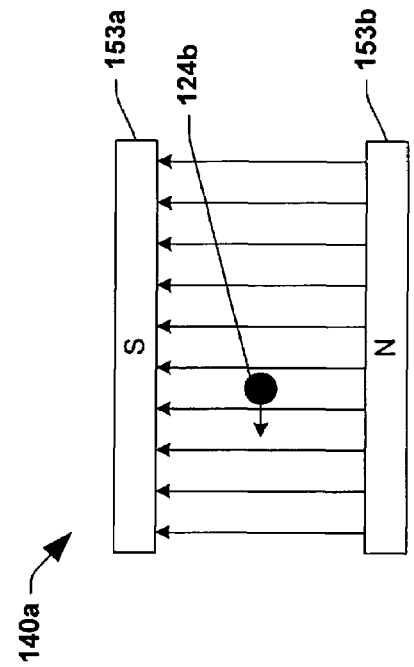
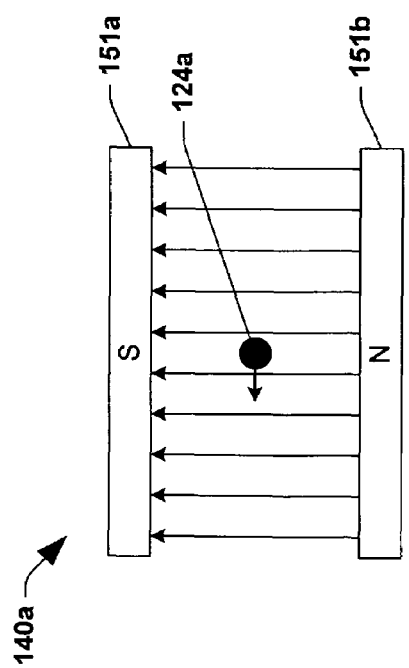
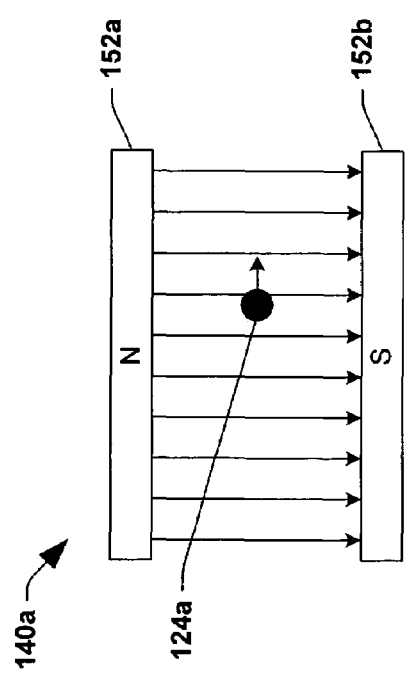

METHOD AND APPARATUS FOR SELECTIVE PRE-DISPERSION OF EXTRACTED ION BEAMS IN ION IMPLANTATION SYSTEMS

FIELD OF THE INVENTION

The present invention relates generally to ion implantation systems, and more specifically to improved methods and apparatus for selectively pre-dispersing extracted ion beams in an ion implantation system.

BACKGROUND OF THE INVENTION

In the manufacture of semiconductor devices, ion implantation is used to dope semiconductor wafers with impurities. Ion implanters or ion implantation systems treat semiconductor wafers with an ion beam, to produce n or p-type doped regions or to form passivation layers in the wafers during fabrication of integrated circuits. When used for doping semiconductors, the ion implantation system injects a selected ion species to produce the desired extrinsic material. Implanting ions generated from source materials such as antimony, arsenic or phosphorus results in n type extrinsic material wafers, whereas if p type extrinsic material wafers are desired, ions generated with source materials such as boron, gallium or indium may be implanted.

FIG. 1 illustrates a conventional low energy ion implantation system 10 having a terminal 12, a beamline assembly 14, and an end station 16. The terminal 12 includes an ion source 20 powered by a high voltage power supply 22 that produces and directs an ion beam 24 to the beamline assembly 14. The beamline assembly 14 consists of a beamguide 32 and a mass analyzer 26 in which a dipole magnetic field is established to pass only ions of appropriate charge-to-mass ratio to a wafer 30 in the end station 16. The ion source 20 generates positively charged ions that are extracted from the source 20 and formed into an ion beam 24, which is directed along a predetermined beam path in the beamline assembly 14 to the end station 16. The ion implantation system may include beam forming and shaping structures extending between the ion source 20 and the end station 16, which maintain the ion beam 24 and bound an elongated interior cavity or passageway through which the beam 24 is transported en route to one or more wafers or workpieces 30 supported in the end station 16. The ion beam transport passageway is typically evacuated to reduce the probability of ions being deflected from the predetermined beam path through collisions with air molecules.

The charge-to-mass ratio of an ion affects the degree to which it is accelerated both axially and transversely by electric or magnetic fields. The mass analyzer 26 is located in the beamline assembly 14 downstream of the ion source 20 and includes a mass analysis magnet creating a dipole magnetic field across the beam path in the passageway. This dipole field operates to deflect various ions in the ion beam 24 via magnetic deflection in an arcuate section of the beamline passageway, which effectively separates ions of different charge-to-mass ratios. The process of selectively separating ions of desired and undesired masses (e.g., charge-to-mass ratios) is referred to as mass analysis. Using mass analysis techniques, the beam imparted on the wafer 30 can be made very pure since ions of undesirable molecular or atomic weight will be deflected to positions away from the beam path and implantation of other than desired materials can be avoided.

Ion implantation systems (ion implanters) typically fall into one of two major categories based on different energy ranges. Low energy implanters are typically designed to provide ion beams of a few thousand electron volts (keV) up to around 80–100 keV, in which the mass analyzed beam is provided from the mass analyzer to an end station for implanting one or more wafers. High energy implanters commonly employ linear acceleration (linac) apparatus (not shown) between the mass analyzer 26 and the end station 16, so as to accelerate the mass analyzed beam 24 to higher energies, typically several hundred keV. High energy ion implantation is commonly employed for deeper implants in a semiconductor wafer 30. Conversely, high current, low energy ion beams 24 are typically employed for high dose, shallow depth ion implantation, in which case the lower energy of the ions commonly causes difficulties in maintaining convergence of the ion beam 24.

Mass analyzers 26 for high and low energy implanters are typically designed for a range of beams 24 of different mass and species. For instance, conventional mass analyzers 26 for low energy applications can provide mass separation for Boron (B11) beams of a few keV as well as Arsenic (As) beams of around 80 keV. In this case, the mass analyzer magnet bend radius is typically around 30 cm due to limitations on the ability to create high mass analyzer dipole magnetic fields to accommodate As beams at 80 keV, wherein impractical higher mass analyzer magnetic fields would be required for smaller bend radius designs. When operated for mass analysis of lower energy beams, such as 1 keV B11 beams, the same mass analyzer magnet is adjusted to provide a lower amplitude dipole field.

The mass analyzer 26 operates as a point-to-point imaging device with a corresponding focal distance. The mass analyzer 26 receives an incoming ion beam 24 along a first path or axis at a certain distance from the mass analyzer entrance, and provides the mass analyzed output beam 24 along a second axis which has a conversion point or 'waist' a certain distance from the exit end of the mass analyzer, at which a resolving aperture 34 is located to allow passage of the desired mass ions and to block or intercept ions of undesired mass. Thus, in implanters 10 having mass analyzers 26 designed to accommodate a wide ion beam energy range, both high and low energy beams 24 must traverse the extra distance between the ion source 20 and the mass analyzer 26 and the distance between the mass analyzer 26 and the resolving aperture 34 necessitated by the large mass analyzer bending radius, sometimes referred to as entrance and exit drift distances, respectively.

Ion beams generally, and high current beams particularly, are comprised of a high concentration of similarly charged (positive) ions which tend to cause the beam 24 to diverge away from the beam path or axis due to mutual repulsion, a space charge effect sometimes referred to as beam blowup. Beam blowup is particularly troublesome in high current, low energy applications because the high concentration of ions in the beam (high current) exaggerates the force of the mutual repulsion of the ions, while the low propagation velocity (low energy) of the ions expose them to these mutually repulsive forces for longer times than in high energy applications. Furthermore, as discussed above, the low energy beams 24 are subjected to these space charge effects over the relatively long drift distances before and after mass analysis, due to the provision of a mass analyzer 26 designed to operate over a wide energy range.

In addition, the space charge effects are more pronounced in the entrance drift distance prior to the extracted ion beam entering the mass analyzer 26, which may be as long as 30–50 cm. This is because the initially extracted beam 24 includes ions of the desired mass, as well as those of undesired mass. In the case of low energy B11 ion beams, for example, the ion source 20 creates a plasma from $BF_3$ source gas, from which the beam ions are extracted. The extracted ion beam 24 includes the desired B11 ions, as well as other undesired constituents, such as Fluorine (F), $BF_1$, and $BF_2$. In this example, the B11 content is typically only about one fourth of the total ions in the initially extracted beam 24. The mass analyzer 26 and the resolving aperture 34 cooperate to restrict the transport of the undesired components, whereby the mass analyzed beam 24 that is provided to the wafer 30 consists largely of B11 ions substantially free of the undesired constituents of the beam 24 initially extracted from the source 20.

As a result of the initial mixture of ion beam constituents, however, the extracted beam current near the source 20 is about 4 times the desired (post-analysis) beam current destined for implantation at the end station. Since the extracted beam current is much larger than the post-analysis current, the extracted beam 24 is subjected to four times as much space charge (e.g., mutual repulsion) prior to entrance into the mass analyzer 26. Accordingly, there is a need for improved ion implantation apparatus and techniques for reducing the adverse effects of space charge neutralization for implanters that support a range of ion beam energies and species.

SUMMARY OF THE INVENTION

The following presents a simplified summary of the invention in order to provide a basic understanding of some aspects of the invention. This summary is not an extensive overview of the invention, and is neither intended to identify key or critical elements of the invention nor to delineate the scope of the invention. Rather, the purpose of the summary is to present some concepts of the invention in a simplified form as a prelude to the more detailed description that is presented later.

The present invention is related to ion implantation systems and methods in which a dispersion system or pre-disperser is provided near the ion source at the beamline assembly entrance, to selectively pass the extracted ion beam from the source to the mass analyzer or to pre-disperse the extracted beam to form a dispersed beam with fewer of the undesired mass constituents that is then directed to the mass analyzer. The dispersion apparatus and methodologies of the invention can be employed in any type of ion implantation system, including high energy implanters having post-mass analysis acceleration components as well as in low energy implanters. The various aspects of the invention may be employed to mitigate space charge effects in transporting low energy ion beams from an ion source to a general purpose mass analyzer designed for a wide range of ion beam energies, through selective removal of ions of undesired mass from the extracted beam, thereby reducing the beam current prior to the main mass analyzer, while allowing higher energy beams to be provided directly to the primary mass analyzer without pre-dispersion.

In one aspect of the invention, an ion implantation system is provided, comprising an ion source to produce an extracted ion beam, a dispersion system located near the ion source to receive the extracted ion beam, a mass analyzer receiving either the extracted ion beam or a dispersed ion beam from the dispersion system, and an end station located downstream from the mass analyzer. The dispersion system selectively passes the extracted ion beam from the ion source toward the mass analyzer or directs a dispersed ion beam toward the mass analyzer having fewer ions of an undesired mass range than the extracted ion beam. Because the dispersion system is used only with low energy extracted ion beams, it can be devised to perform the dispersion in a very short distance, thus limiting the effect of space charge expansion that results from the entire extracted beam. In the exemplary implementations illustrated and described below, the dispersion system comprises a plurality of magnets providing dipole magnetic fields near the beamline assembly entrance to selectively direct the extracted beam to a resolving structure that intercepts ions of undesired mass and passes ions of a desired mass to the main mass analyzer. The dispersion system magnets in one example are configured to direct the extracted beam through a double dog-leg path that includes the resolving structure, and the dispersed beam is redirected toward the main mass analyzer along the original extracted beam path. In another implementation, the dispersion system selectively redirects the extracted beam along a single dog-leg path for dispersion, wherein the dispersed beam is provided to the main mass analyzer along a second path.

Another aspect of the invention provides a beamline assembly for transporting ions from an ion source to an end station in an ion implantation system. The beamline assembly comprises a dispersion system that receives an extracted ion beam from an ion source, and a mass analyzer that receives either the extracted ion beam or a dispersed ion beam from the dispersion system and directs ions of a desired mass range toward an end station. The dispersion system selectively passes the extracted ion beam from the ion source toward the mass analyzer or directs a dispersed ion beam toward the mass analyzer that has fewer ions of an undesired mass range than the extracted ion beam.

Yet another aspect of the invention provides a method of generating a mass analyzed ion beam in an ion implantation system. The method comprises providing an extracted ion beam having ions of a desired mass range and ions of an undesired mass range, and selectively passing the extracted ion beam to the mass analyzer or deriving a dispersed ion beam from the extracted ion beam and providing the dispersed ion beam to a mass analyzer, where the dispersed ion beam has fewer ions of the undesired mass range than the extracted ion beam. The method further comprises removing at least some ions of the undesired mass range from the dispersed ion beam or from the extracted ion beam using the mass analyzer to generate a mass analyzed ion beam.

The following description and annexed drawings set forth in detail certain illustrative aspects and implementations of the invention. These are indicative of but a few of the various ways in which the principles of the invention may be employed.

BRIEF DESCRIPTION OF THE DRAWINGS

FIGS. 3E–3H are partial side elevation views taken in section along corresponding section lines of FIG. 3D, illustrating exemplary dipole magnetic fields and the resulting lateral beam direction in the dispersion system of FIGS. 3A–3D;

DETAILED DESCRIPTION OF THE INVENTION

Figure 2:
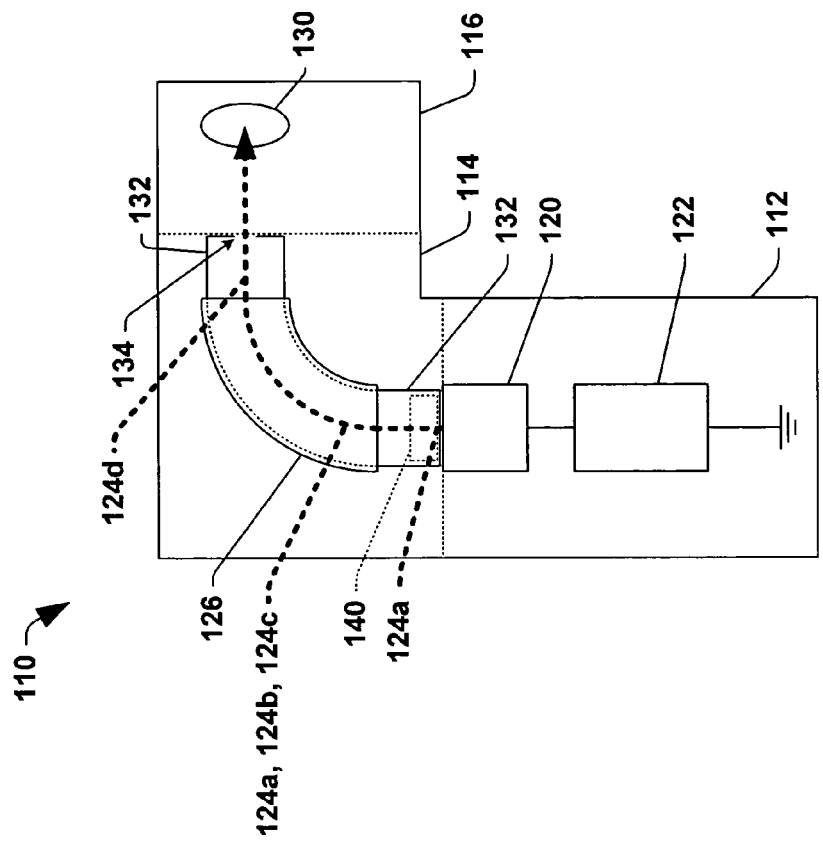
FIG. 2 is a schematic diagram illustrating an exemplary low energy ion implantation system having A dispersion system in accordance with one or more aspects of the present invention.
Figure 1:
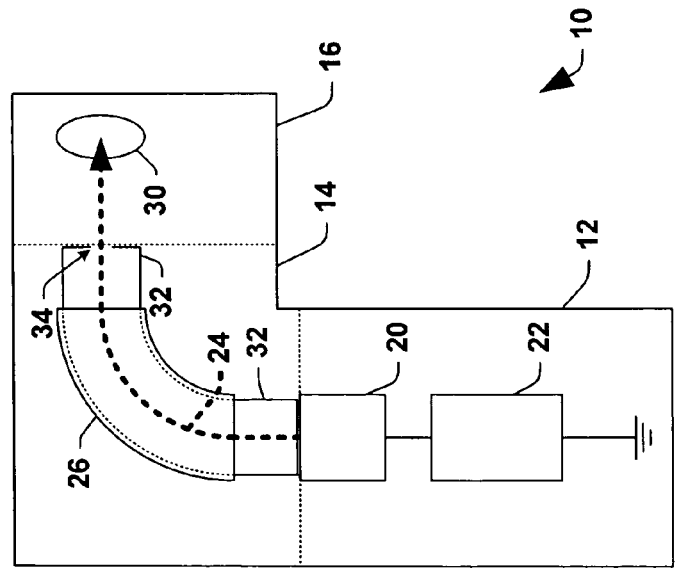
FIG. 1 is a schematic diagram illustrating a conventional low energy ion implantation system.

The present invention will now be described with reference to the drawings wherein like reference numerals are used to refer to like elements throughout, and wherein the illustrated structures are not necessarily drawn to scale. The present invention provides ion implantation systems and beamline assemblies therefor, having dispersion systems that selectively pre-disperse low energy beams prior to a main mass analyzer to facilitate beam transfer without beam blowup, and also to allow passage of higher energy beams directly to the main mass analyzer. Several examples of low energy implantation systems and beamline assemblies therefor are hereinafter presented in order to illustrate the various aspects of the invention. However, it will be appreciated that the invention may be advantageously employed in ion implanter systems apart from those illustrated and described herein, including high energy implanters having acceleration components.

FIG. 2 illustrates an exemplary ion implantation system 110 having a dispersion system 140 in accordance with the invention. The system 110 comprises a terminal 112, a beamline assembly 114, and an end station 116, where the terminal 112 includes an ion source 120 powered by a high voltage power supply 122 that produces and directs an extracted ion beam 124a to the beamline assembly 114. The beamline assembly 114 transports ions from the source 120 to the end station 116, and comprises a beamguide 132 and a mass analyzer 126, with the dispersion system 140 located at the beamline entrance near the source 120. FIGS. 3A–3H illustrate one possible implementation of a beamline assembly 114a having a dispersion system 140a, and FIGS. 4A and 4B illustrate another exemplary beamline assembly 114b with a dispersion system 140b in the implantation system 110 according to the invention. As further illustrated in the examples of FIGS. 3A–3C, 4A, and 4B, the ion source 120 generates positively charged ions that are extracted from a plasma chamber 120a using one or more negatively biased extraction electrodes 120b, whereby the positive ions are formed into an extracted ion beam 124a, which is directed through a beam path in the beamline assembly 114 to the end station 116 in a first operational mode.

In accordance with the present invention, the dispersion system 140 receives the extracted beam 124a and selectively passes the extracted ion beam 124a to the mass analyzer 126 or directs a dispersed ion beam 124b, 124c toward the mass analyzer 126, the dispersed ion beam 124b, 124c having fewer ions of an undesired mass range than the extracted ion beam 124a. The dispersion system 140 selectively derives the dispersed ion beam 124b, 124c from the extracted ion beam 124a by removing at least some ions of an undesired mass range from the extracted ion beam 124a, while passing some or all ions of a desired mass range to the mass analyzer 126 in the form of a beam 124b, 124c, referred to herein as a dispersed ion beam 124b, 124c, which has fewer ions of the undesired mass than the extracted beam 124a. In one possible application, the dispersion system 140 is disengaged in a first mode for higher energy beams, for example, Arsenic beams of energies of a few keV to about 80–100 keV, which are extracted from the source 120 and are directed to the mass analyzer 126 without being affected by the dispersion system 140. In a second mode, low energy beams, such as Boron beams of a few keV energy or less are pre-dispersed in the system 140, with a dispersed beam 124b, 124c (e.g., of higher Boron content) being provided to the mass analyzer 126.

The pre-dispersion of some of the unwanted constituents of the initially extracted ion beam 124a lowers the beam current in the portion of the beamline assembly 114 between the dispersion system 140 and the mass analyzer 126, whereby space charge effects therein are correspondingly reduced. This allows an increase in the extracted ion current while safely transporting low energy beams 124b, 124c without beam blowup, and/or reduction in the beam susceptibility to beam blowup along the entrance drift distance between the dispersion system 140 and the mass analyzer 126 than was possible with conventional implanters. Any form of dispersion system 140 may be employed within the scope of the invention, which selectively passes the extracted ion beam 124a to the mass analyzer 126 or directs a dispersed ion beam 124b, 124c toward the mass analyzer 126, such that the dispersed ion beam 124b, 124c has fewer ions of an undesired mass range than the extracted ion beam 124a.

In the examples illustrated and described below, the dispersion system 140 includes electromagnets operable in a dispersion mode to generate at least two dipole magnetic fields of different orientations. When energized, the magnetic fields deflect the extracted beam 124a through a resolving structure to remove some or all the ions of the undesired mass range and direct the resulting dispersed beam 124b, 124c to the main mass analyzer 126 for final mass separation, resulting in a final mass analyzed ion beam 124d provided from the mass analyzer 126 to the end station 116 through a final resolving aperture 134 at the beamline assembly exit. In a first operational mode, the dispersion system 140 is de-energized, whereby the extracted ion beam 124a passes through the dispersion system 140 substantially unchanged to the mass analyzer 126. This dual mode operation facilitates more optimized transport of low energy ion beams with the dispersion system 140 on, while also allowing the implantation system 110 to support higher energy beams, wherein the dispersion systems 140 of the invention may advantageously be designed for installation into existing implanters with littler or no modification in many cases.

FIGS. 3A–3H illustrate one implementation of a beamline assembly 114a in the exemplary ion implantation system 110 of FIG. 2. The beamline assembly 114a comprises a dispersion system 140a that receives the extracted ion beam 124a from the ion source 120 and a mass analyzer 126a that receives either the extracted ion beam 124a in a first mode (FIGS. 3A and 3C) or a dispersed ion beam 124b in a second mode from the dispersion system 140a (FIG. 3B) and directs a mass analyzed beam 124d having ions of a desired mass range toward the end station 116 (FIG. 2).

Figure 3A:
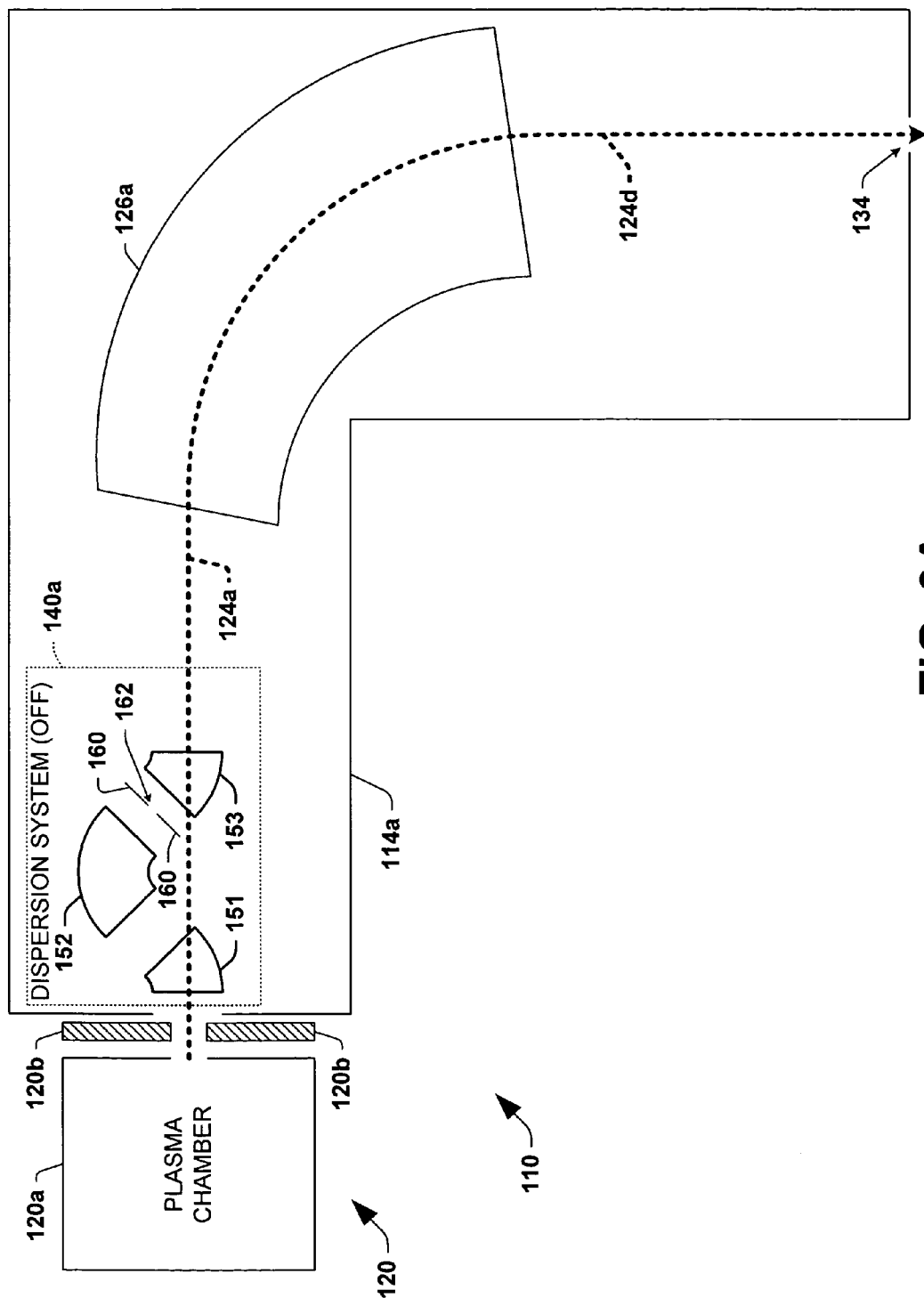
FIG. 3A is a top plan view illustrating one implementation of the beamline assembly in the ion implantation system of FIG. 2, having a dispersion system shown in a first mode with the dispersion system magnets off to selectively pass an extracted ion beam to a mass analyzer along a first path.
Figure 4A:
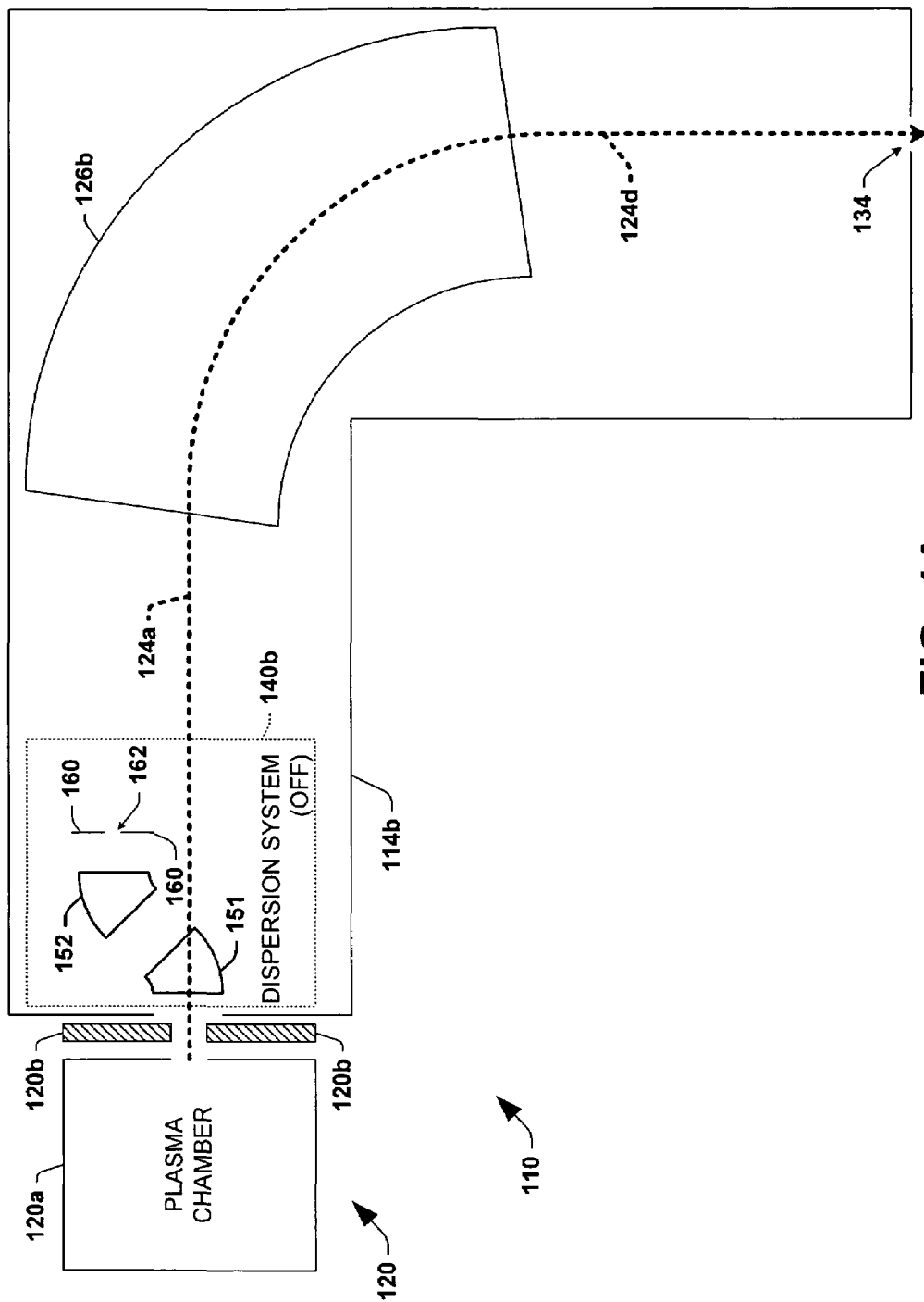
FIG. 4A is a top plan view illustrating another exemplary implementation of the beamline assembly in the ion implantation system of FIG. 2, having a dispersion system shown in a first mode with the dispersion system magnets off to selectively pass the extracted ion beam to the mass analyzer along a first path.
Figure 4B:
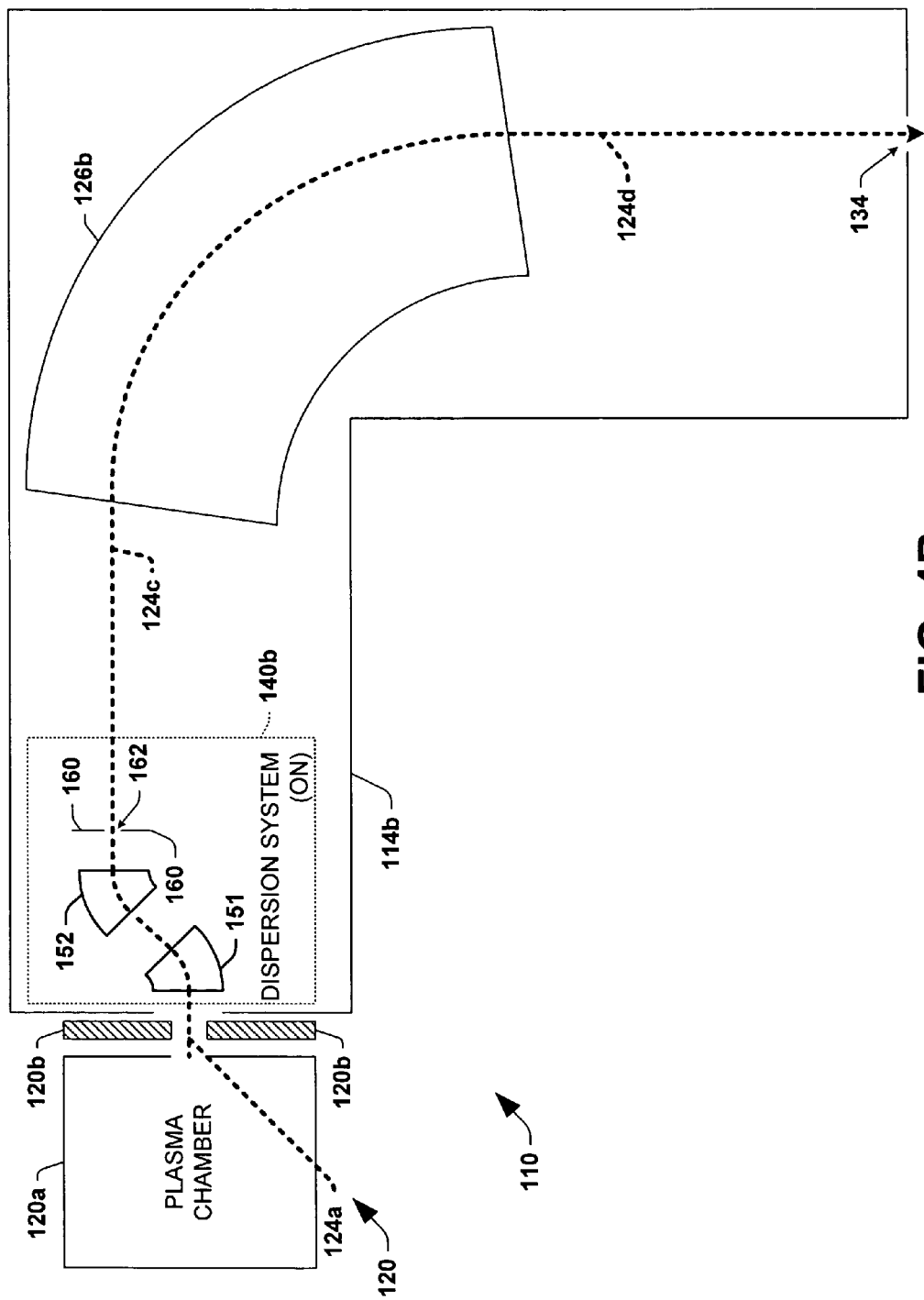
FIG. 4B is a top plan view illustrating the beamline assembly of FIG. 4A with the dispersion system magnets energized in a second mode to direct the extracted beam through a single dog-leg path with a resolving structure to create a dispersed beam that is directed toward the main mass analyzer along a second path.

As illustrated in FIG. 3A, the exemplary dispersion system 140a comprises three electro-magnets 151, 152, and 153, as well as a resolving structure 160 with one or more blocking surfaces and an aperture 162, which are located near the ion source 120 at an entrance end of the beamline assembly 114a. Any form of magnetic field generating devices may be used within the scope of the invention, including but not limited to electromagnets, permanent magnets, and/or combinations thereof. In a first operational mode of FIG. 3A, the magnets 151–153 are off (e.g., de-energized), allowing the extracted ion beam 124a to pass through the dispersion system 140 unmodified to the mass analyzer 126a along a first path.

Figure 3B:
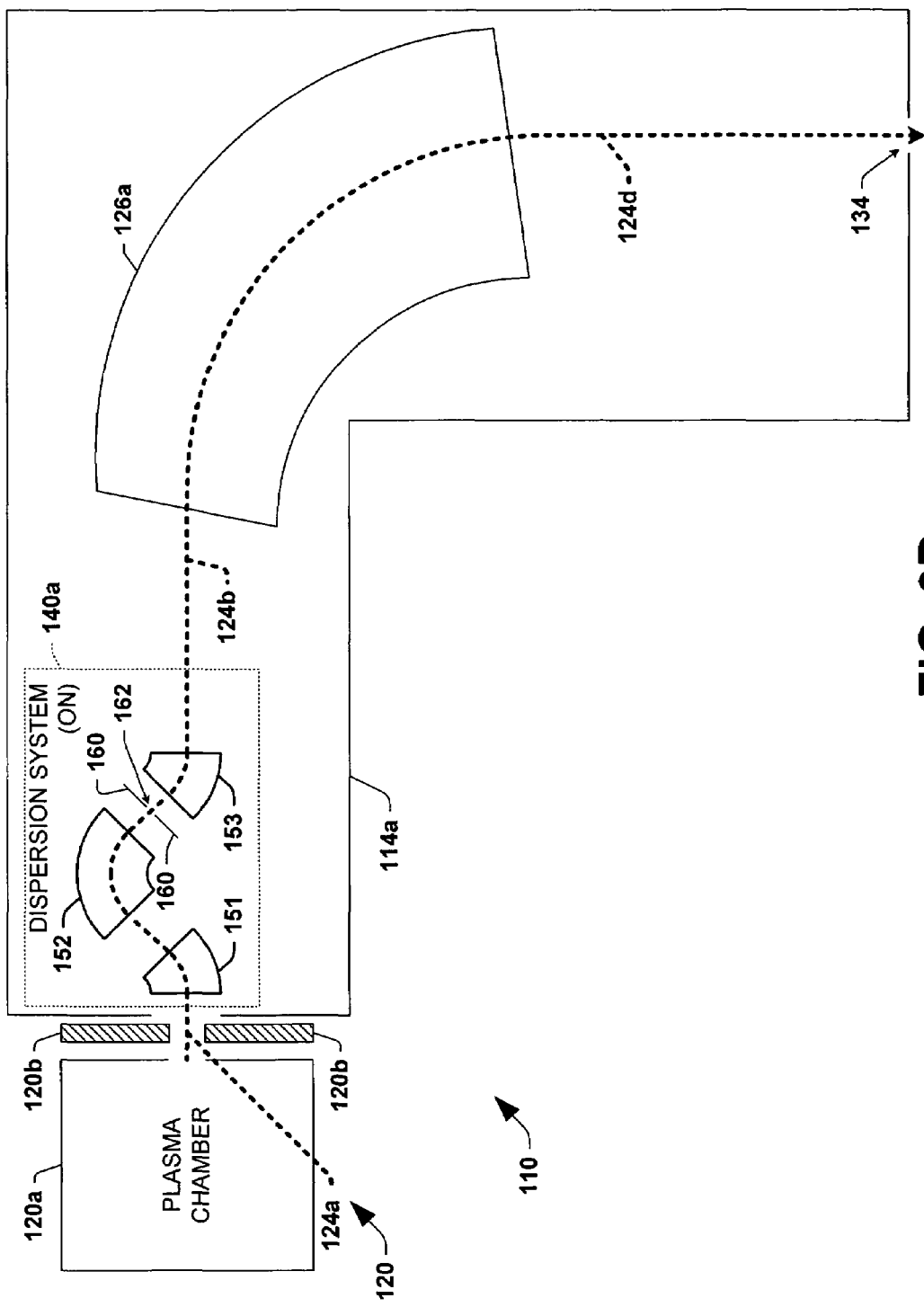
FIG. 3B is a top plan view illustrating the beamline assembly of FIG. 3A with the dispersion system magnets energized in a second mode to direct the extracted beam through a double dog-leg path with a resolving structure to create a dispersed beam that is directed toward the main mass analyzer along the first path.

FIGS. 3B and 3D–3H illustrate a second operational mode of the dispersion system 140a, in which the magnets 151–153 are energized to create dipole magnetic fields within the dispersion system 140a. As shown in FIG. 3B, the magnetic fields of the magnets 151–153 cooperatively direct the extracted ion beam 124a initially away from the original first path through a double dog-leg path to the resolving structure 160. The resolving structure 160 and the aperture 162 thereof are situated such that undesired ions are generally intercepted or blocked by the blocking surface of the structure 160 and ions of the desired mass range pass through the aperture 162 to form the dispersed beam 124b. These desired ions are then directed by the dispersion system back onto the first path, whereby the dispersed beam 124b is provided to the entrance of the main mass analyzer 126a.

Figure 3C:
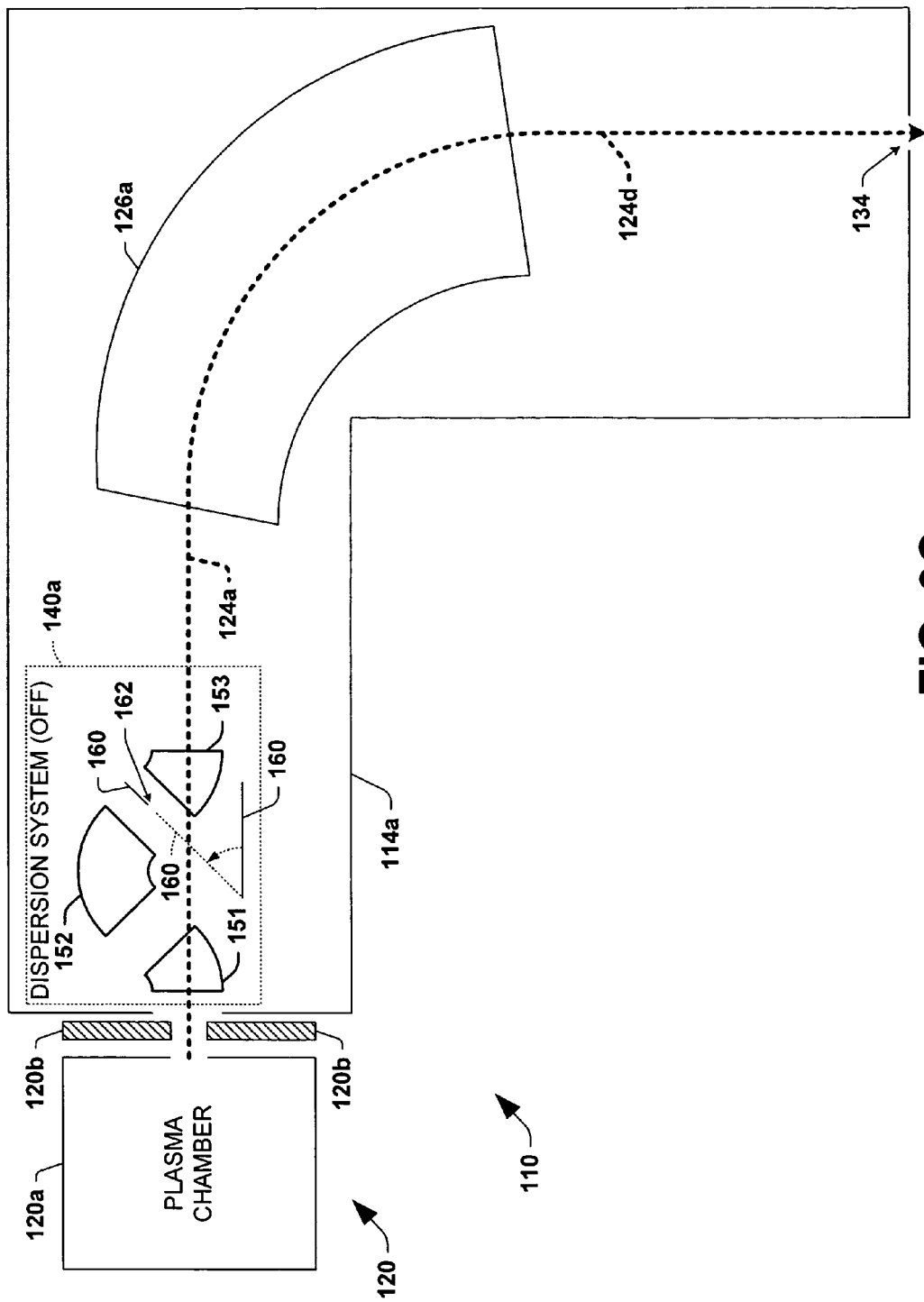
FIG. 3C is a top plan view illustrating an alternative implementation of the beamline assembly of FIGS. 3A and 3B, in which the resolving structure of the dispersion system is movable between first and second positions in the first and second operational modes.

In the implementation of FIGS. 3A and 3B, the resolving structure 160 is generally fixed, such that in the first operational mode (FIG. 3A), the structure 160 does not obstruct the transport of the extracted beam 124a from the source 120 to the mass analyzer 126. FIG. 3C illustrates one possible alternative implementation of the dispersion system 140a, in which the resolving structure 160 is movable between a first position in the first operational mode in which the resolving structure 160 does not obstruct passage of the extracted ion beam 124a along the first path, and a second position in the second operational mode in which the resolving structure 160 at least partially obstructs passage of the extracted ion beam 124a along the first path. Other implementations are possible within the scope of the invention, wherein a resolving structure 160 is provided, which intercepts at least some ions of the undesired mass range and passes at least some ions of the desired mass range to the mass analyzer in the second mode.

Figure 3D:
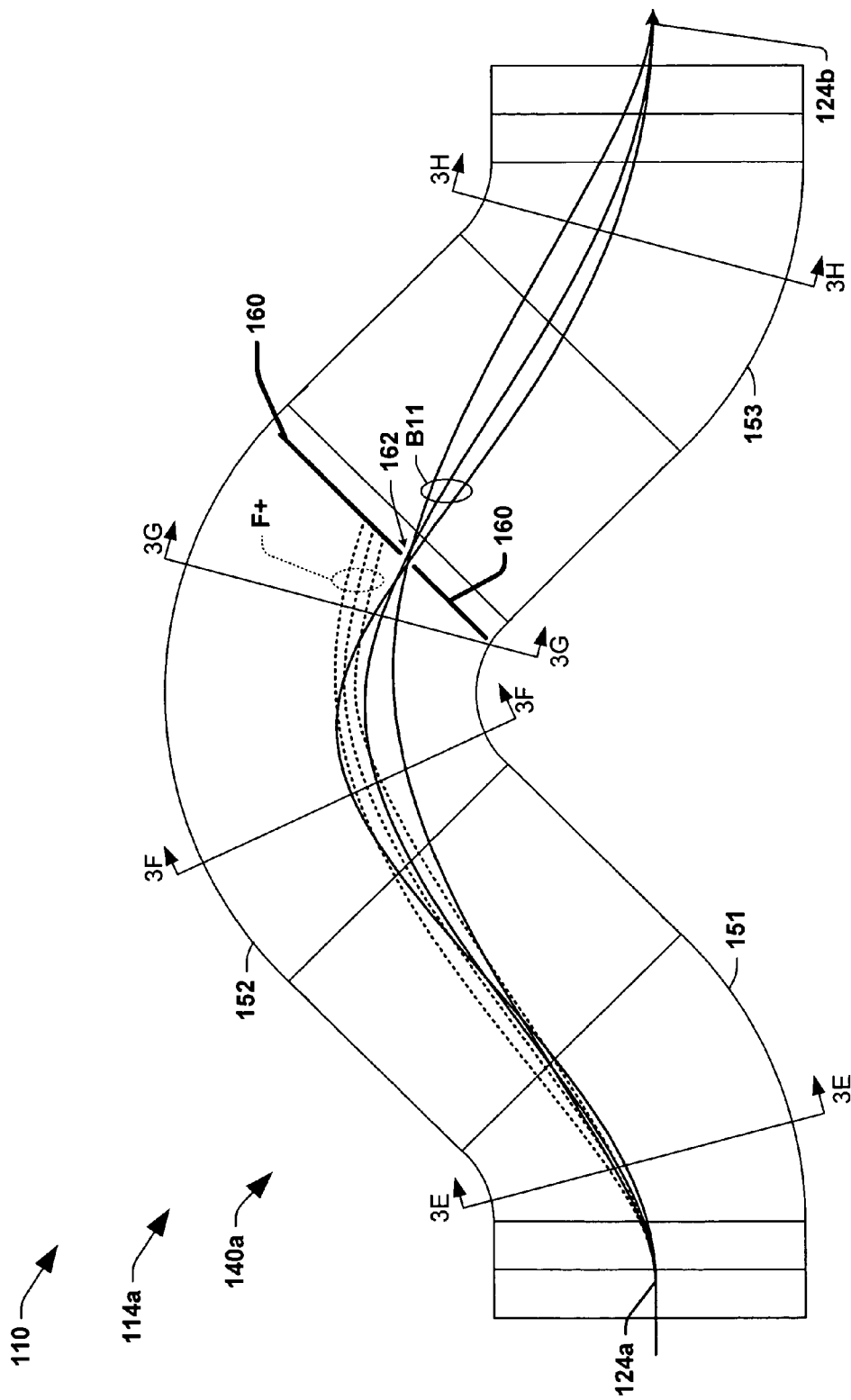
FIG. 3D is a top plan view illustrating further details of the dispersion system magnets and resolving structure in the beamline assembly of FIGS. 3A and 3B.

Referring also to FIGS. 3D–3H, FIG. 3D illustrates further details of the magnets 151–153 and the resolving structure 160 in the dispersion system 140a, and FIGS. 3E–3H provide sectional side views illustrating the dipole magnetic fields and the resulting lateral beam direction in the dispersion system 140a taken along the corresponding section lines 3E—3E, 3F—3F, 3G—3G, and 3H—3H in FIG. 3D. FIG. 3D illustrates one operational example in the second mode, in which it is desired to implant a wafer with Boron B11, where the source 120 provides an extracted ion beam 124a comprising B11 as well as one or more constituents of undesired masses, such as Fluorine F+(e.g., and also $BF_1$ and $BF_2$) resulting from extraction from a $BF_3$ source gas in the plasma chamber 120a in FIG. 3A.

The extracted beam 124a is provided from the source 120 along the first path, and initially encounters a first magnetic field in the first magnet 151. The first magnet includes upper and lower pole pieces 151a and 151b, where the first dipole magnetic field lines go from the lower piece (e.g., North pole) to the upper piece 151a (e.g., South pole), causing a lateral force on the ions in the beam 124a to the left, as shown in FIG. 3E (e.g., upward in FIG. 3D). The extracted beam 124a is thus directed away from the first path in a first direction toward the second dipole magnet 152. FIGS. 3F and 3G illustrate the beam 124a in the second magnet 152 having upper and lower pole pieces 152a and 152b, respectively, that create a second magnetic field with field lines running from the upper piece 152a to the lower piece 152b. This second magnetic field directs the extracted beam 124a back to the right in a second direction away from the first direction, and also directs the beam 124a back toward the first path (e.g., back toward the resolving structure 160 in FIG. 3D).

The fields of the magnets 151–153 and the location of the resolving structure 160 are such that at least some F+, $BF_1$, and $BF_2$ ions of the undesired mass range are directed to the blocking surface or surfaces of the resolving structure 160, while at least some desired B11 ions are directed through the aperture 162 of the resolving structure 160 to form the dispersed ion beam 124b. In the illustrated example, the magnets 151 through 153 may be constructed as a single subassembly with oppositely configured windings so as to provide the first and third dipole magnets 151 and 153 with magnetic field orientation opposite that of the central or second dipole magnet 152 to essentially bend the extracted beam 124a in a double dog-leg path, wherein no return yoke is required in the illustrated example, as the magnetic flux through the first and last magnets 151 and 153, is returned through the central magnet 152.

Once the desired ions have passed through the aperture 162 in the resolving structure 160, the resulting dispersed beam 124b encounters the third magnet 153, as further illustrated in FIG. 3H. The magnet 153 comprises upper and lower pole pieces 153a and 153b that create a third magnetic field with a different orientation that the second field of the second magnet 152. The field lines of the third magnet 153 extend from the lower piece 153b to the upper piece 153a and exert a force on the beam 124b as illustrated in FIGS. 3D and 3H that directs the dispersed beam 124b back along the first path. Thus, the magnetic fields provided by the magnets 151–153 provide a double dog-leg shaped subpath along which the beam 124a is directed for initial removal (e.g., dispersion) of some or all undesired ions prior to transporting the resulting dispersed beam 124b to the mass analyzer 126 in the second mode of operation.

As shown in FIG. 3B, this particular implementation facilitates provision of the dispersed beam 124b into the mass analyzer 126 in the second operational mode along the same path used for the extracted beam 124a in the first operational mode, whereby the mass analyzer 126a may not need to be altered for existing implanters 110 into which the dispersion system 140a is being installed. It is noted, however, that since the dispersed beam 124b is presented to the main mass analyzer 126a in the second mode (FIG. 3B) at a shorter distance from the mass analyzer entrance than is the extracted beam 124a in the first mode (FIG. 3A), the exit drift distance between the mass analyzer 126a and the final resolving aperture 134, and/or the size of the aperture 134 may need to be adjusted, separately or along with adjustments of the focusing properties of the mass analyzer 126a, to compensate for the difference in entrance drift length (e.g., shifted object distance).

In this regard, it is desirable to locate the dispersion system 140a in a small initial portion of the entrance drift distance between the source 120 and the mass analyzer 126a. In the example of FIGS. 3A–3H, the bending radius along this subpath in the dispersion system 140a is about 5 cm to provide very aggressive mass separation (e.g., dispersion) to reduce the space charge effects seen by the desired ions of the dispersed beam 124b. It is noted that the mass separation performance of the dispersion system 140a is not critical to the overall system mass separation performance, but only needs to provide some measure of crude mass resolution. For example, for Boron beams 124, the dispersion system 140a only needs to have relatively low mass resolution or resolving power of about 2/1 to effectively separate all or most of the B11 ions at an atomic mass of about 11 from all or most of the nearest major constituent Fluorine (F+ in FIG. 3D) having a mass of about 19. Thus, the system 140a preferably has fairly strong focusing properties (e.g., small bending radius) with respect to ion beams of relatively low energies (e.g., about 500 eV to about 3 keV in one example) that are provided in the second operational mode, where the resulting initial dispersion reduces the amount of beam current transported, and hence the susceptibility to space charge effects, along the remaining entrance drift length between the dispersion system 140a and the mass analyzer 126a.

FIGS. 4A and 4B illustrate another possible implementation of the present invention, in which a potentially smaller dispersion system 140b is employed in a beamline assembly 114b. In this example, only two magnets 151 and 152 are employed in the system 140b to direct the extracted beam through a single dog-leg shaped alternate path, along with a resolving structure 160 with an aperture 162 to create a dispersed beam 124c in a second operational mode. The beamline assembly 114b of FIGS. 4A and 4B comprises a dispersion system 140b that receives an extracted ion beam 124a from the ion source 120 and a somewhat modified mass analyzer 126b that receives either the extracted ion beam 124a along a first path in a first mode (FIG. 4A) or a dispersed ion beam 124c along a second path in a second mode (FIG. 4B) from the dispersion system 140b.

In the first operational mode of FIG. 4A, the dispersion system magnets 151 and 152 are off, and the extracted ion beam 124a is allowed to propagate from the source 120 to the entrance of the mass analyzer 126b along a first path. The mass analyzer 126b performs a mass separation function and provides a mass analyzed beam 124d to the end station 116 (FIG. 2) through a resolving aperture 134 at an exit end of the beamline assembly 114b. In a second operational mode, the dispersion system magnets 151 and 152 are energized to provide first and second differently oriented dipole magnetic fields (e.g., similar to those shown in FIGS. 3E and 3F above), whereby the extracted beam 124a is directed away from the first path and onto a second, generally parallel path. The beam 124a then encounters the resolving structure 160 along the second path, whereby ions of a desired mass range pass through the aperture 162 thereof (e.g., with all or most of the undesired ions being blocked by the resolving structure 160), resulting in a dispersed beam 124c.

The dispersed beam 124c is thus directed to the entrance of the mass analyzer 126b along the second path, and enters the mass analyzer 126b at a different location than the extracted beam 124a in FIG. 4A. As a result, the approach of FIGS. 4A and 4B may require a mass analyzer 126b with a wider magnet entrance than does the implementation of FIGS. 3A–3H above. However, this design may allow for correction of object distance shift, and may be more compact than the above example of FIGS. 3A–3H.

Many different implementations are possible within the scope of the invention. In this regard, while the preliminary ion beam bending in the above examples occurs generally within the plane of the mass analyzer 126, this is not a requirement of the invention, wherein the magnetic fields in the dispersion system 140 and the resulting alternate beam path of the beams 124b, 124c in the second operational mode may be at any angle with respect to the mass analyzer plane. Thus, for example, the dispersion system 140a of FIGS. 3A–3H may be modified to bend the extracted beam 124a in a variety of directions in one or more planes that are not necessarily coplanar with the plane of the beam 124 as it is bent through the main mass analyzer 126a.

Furthermore, while the exemplary dispersion systems 140a and 140b receive the extracted beam 124a in the second operational mode along the same first path used in the first mode in the examples of FIGS. 3A–3H, 4A, and 4B above, this is not a strict requirement of the invention. Moreover, linear acceleration components may alternatively be provided following the main mass analyzer 126 in ion implantation systems 110 within the scope of the invention. The electro-magnets 151–153 illustrated and described above may be constructed using any suitable materials with windings provided in any suitable configuration to create fields for selective pre-dispersion of the extracted beam 124a when energized. In addition, any suitable magnetic field generating devices may be used in creating the fields for selective dispersion of an extracted beam. For instance, permanent magnets may be located in a position to impart suitable fields upon an extracted beam 124a to direct the beam to a resolving structure and to direct a resulting dispersed beam 124b, 124c to a main mass analyzer 126 in a second operational mode, which can be moved to another location in a first mode, such that an extracted beam 124a is not pre-dispersed in the first mode.

Although the invention has been illustrated and described with respect to one or more implementations, alterations and/or modifications may be made to the illustrated examples without departing from the spirit and scope of the appended claims. In particular regard to the various functions performed by the above described components or structures (blocks, units, engines, assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An ion implantation system, comprising:
   an ion source operable to produce an extracted ion beam;
   a dispersion system located near the ion source to receive the extracted ion beam; and
   a mass analyzer having an entrance and an exit, the mass analyzer receiving either the extracted ion beam or a dispersed ion beam from the dispersion system at the entrance and directing ions of a desired mass range to the exit;
   wherein the dispersion system is operable to selectively pass the extracted ion beam from the ion source to the mass analyzer or to direct a dispersed ion beam toward the mass analyzer, the dispersed ion beam having fewer ions of an undesired mass range than the extracted ion beam.

2. The ion implantation system of claim 1, wherein the dispersion system is operable to selectively pass the extracted ion beam from the ion source toward the mass analyzer along a first path in a first mode or to direct the dispersed ion beam toward the mass analyzer along the first path in a second mode.

3. The ion implantation system of claim 2, wherein the dispersion system is operable to direct the extracted ion beam away from the first path and to redirect ions of the desired mass range back onto the first path to create the dispersed ion beam in the second mode.

4. The ion implantation system of claim 3, wherein the dispersion system comprises:
   a first magnetic field generating device providing a first magnetic field along the first path that directs ions from the extracted beam away from the first path in the second mode;
   a second magnetic field generating device providing a second magnetic field that directs ions from the extracted beam back toward the first path in the second mode; and
   a resolving structure that intercepts at least some ions of the undesired mass range and passes at least some ions of the desired mass range to the mass analyzer in the second mode.

5. The ion implantation system of claim 4, wherein the resolving structure is movable between a first position in the first mode in which the resolving structure does not obstruct passage of the extracted ion beam along the first path, and a second position in the second mode in which the resolving structure at least partially obstructs passage of the extracted ion beam along the first path, intercepts at least some ions of the undesired mass range and passes at least some ions of the desired mass range to the mass analyzer in the second mode.

6. The ion implantation system of claim 4, wherein the dispersion system comprises a third magnetic field generating device providing a third magnetic field that directs ions of the desired mass range toward the mass analyzer along the first path in the second mode.

7. The ion implantation system of claim 3, wherein the dispersion system comprises:
   a resolving structure comprising at least one blocking surface and an aperture; and
   a plurality of dipole magnets operable to provide a plurality of magnetic fields in the dispersion system in the second mode, wherein the plurality of magnetic fields direct at least some ions of the undesired mass range from the extracted ion beam to the at least one blocking surface of the resolving structure and direct at least some ions of the desired mass range through the aperture of the resolving structure to form the dispersed ion beam.

8. The ion implantation system of claim 3, wherein the dispersion system comprises:
   a resolving structure comprising at least one blocking surface and an aperture; and
   a first magnetic field generating device providing a first dipole magnetic field of a first orientation near the ion source, wherein the first dipole magnetic field directs ions from the extracted beam away from the first path in a first direction in the second mode;
   a second magnetic field generating device providing a second dipole magnetic field of a second orientation, the second orientation being different than the first orientation, wherein the second dipole magnetic field directs ions in a second direction away from the first direction toward the resolving structure, wherein the second dipole magnetic field directs at least some ions of the undesired mass range to the at least one blocking surface of the resolving structure, and wherein the second dipole magnetic field directs at least some ions of the desired mass range through the aperture of the resolving structure to form the dispersed ion beam; and
   a third magnetic field generating device providing a third dipole magnetic field of a third orientation, the third orientation being different than the second orientation, wherein the third dipole magnetic field directs ions of the dispersed ion beam toward the mass analyzer along the first path.

9. The ion implantation system of claim 8, wherein the first, second, and third magnetic field generating devices are dipole electromagnets.

10. The ion implantation system of claim 1, wherein the dispersion system is operable to selectively pass the extracted ion beam from the ion source toward the mass analyzer along a first path in a first mode or to direct the dispersed ion beam toward the mass analyzer along a second path in a second mode.

11. The ion implantation system of claim 10, wherein the dispersion system is operable to direct the extracted ion beam away from the first path and to redirect ions of the desired mass range toward the mass analyzer along the second path in the second mode.

12. The ion implantation system of claim 11, wherein the dispersion system comprises:
   a first magnetic field generating device providing a first magnetic field along the first path that directs ions from the extracted beam away from the first path in the second mode;
   a second magnetic field generating device providing a second magnetic field that directs ions from the extracted beam along the second path in the second mode; and
   a resolving structure that intercepts at least some ions of the undesired mass range and passes at least some ions of the desired mass range to the mass analyzer along the second path in the second mode.

13. The ion implantation system of claim 11, wherein the dispersion system comprises:
   a resolving structure comprising at least one blocking surface and an aperture; and
   a plurality of dipole magnets operable to provide a plurality of magnetic fields in the dispersion system in the second mode, wherein the plurality of magnetic fields direct at least some ions of the undesired mass range from the extracted ion beam to the at least one blocking surface of the resolving structure and direct at least some ions of the desired mass range through the aperture of the resolving structure and toward the mass analyzer to form the dispersed ion beam along the second path.

14. The ion implantation system of claim 11, wherein the dispersion system comprises:
  a resolving structure comprising at least one blocking surface and an aperture; and
  a first magnetic field generating device providing a first dipole magnetic field of a first orientation near the ion source, wherein the first dipole magnetic field directs ions from the extracted beam away from the first path in a first direction in the second mode;
  a second magnetic field generating device providing a second dipole magnetic field of a second orientation, the second orientation being different than the first orientation, wherein the second dipole magnetic field directs ions in a second direction toward the resolving structure, wherein the second dipole magnetic field directs at least some ions of the undesired mass range to the at least one blocking surface of the resolving structure, wherein the second dipole magnetic field directs at least some ions of the desired mass range through the aperture of the resolving structure to form the dispersed ion beam, and wherein the second dipole magnetic field directs ions of the dispersed ion beam toward the mass analyzer along the second path.

15. The ion implantation system of claim 1, wherein the dispersion system derives the dispersed ion beam from the extracted ion beam.

16. The ion implantation system of claim 15, wherein the dispersion system removes at least some ions of the undesired mass range from the extracted ion beam to derive the dispersed ion beam.

17. A beamline assembly for transporting ions from an ion source to an end station in an ion implantation system, the beamline assembly comprising:
  a dispersion system that receives an extracted ion beam from an ion source; and
  a mass analyzer that receives either the extracted ion beam or a dispersed ion beam from the dispersion system and directs ions of a desired mass range toward an end station;
  wherein the dispersion system is operable to selectively pass the extracted ion beam from the ion source to the mass analyzer or to direct a dispersed ion beam toward the mass analyzer, the dispersed ion beam having fewer ions of an undesired mass range than the extracted ion beam.

18. The beamline assembly of claim 17, wherein the dispersion system is operable to selectively pass the extracted ion beam from the ion source toward the mass analyzer along a first path in a first mode or to direct the dispersed ion beam toward the mass analyzer along the first path in a second mode.

19. The beamline assembly of claim 17, wherein the dispersion system is operable to selectively pass the extracted ion beam from the ion source toward the mass analyzer along a first path in a first mode or to direct the dispersed ion beam toward the mass analyzer along a second path in a second mode.

20. The beamline assembly of claim 17, wherein the dispersion system derives the dispersed ion beam from the extracted ion beam.

21. The beamline assembly of claim 20, wherein the dispersion system removes at least some ions of the undesired mass range from the extracted ion beam to derive the dispersed ion beam.

22. A method of generating a mass analyzed ion beam in an ion implantation system, the method comprising:
  providing an extracted ion beam having ions of a desired mass range and ions of an undesired mass range;
  selectively passing the extracted ion beam to the mass analyzer or deriving a dispersed ion beam from the extracted ion beam and providing the dispersed ion beam to a mass analyzer, wherein the dispersed ion beam has fewer ions of the undesired mass range than the extracted ion beam; and
  removing at least some ions of the undesired mass range from the dispersed ion beam or the extracted ion beam using the mass analyzer to generate a mass analyzed ion beam.

23. The method of claim 22, wherein deriving the dispersed ion beam from the extracted ion beam comprises removing at least some ions of the undesired mass range from the extracted ion beam.

24. The method of claim 23, wherein removing at least some ions of the undesired mass range from the extracted ion beam comprises:
  providing a first dipole magnetic field of a first orientation that deflects ions of the extracted ion beam;
  providing a second dipole magnetic field of a second orientation that directs at least some ions of the undesired mass range to a blocking surface of a resolving structure, and directs at least some ions of the desired mass range through an aperture of the resolving structure to form the dispersed ion beam.

25. The method of claim 24, wherein providing the dispersed ion beam to a mass analyzer comprises providing a third dipole magnetic field that directs the dispersed ion beam toward the mass analyzer along an original path of the extracted ion beam.

* * * * *